(12) United States Patent
Effing et al.

(10) Patent No.: US 10,516,372 B1
(45) Date of Patent: Dec. 24, 2019

(54) LOW COST LF DRIVER CURRENT SENSE TOPOLOGY

(71) Applicant: NXP B.V., Eindhoven (NL)

(72) Inventors: Hermanus J. Effing, Overasselt (NL); Dimitar M. Dochev, Nijmegen (NL); Maarten J. Swanenberg, Berg en Dal (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/026,180

(22) Filed: Jul. 3, 2018

(51) Int. Cl.
| | |
|---|---|
| *H03F 3/217* | (2006.01) |
| *H03F 3/45* | (2006.01) |
| *G01R 19/00* | (2006.01) |
| *G01R 15/14* | (2006.01) |
| *G01R 19/25* | (2006.01) |

(52) U.S. Cl.
CPC ........... *H03F 3/217* (2013.01); *G01R 15/146* (2013.01); *G01R 19/2513* (2013.01); *H03F 3/45475* (2013.01)

(58) Field of Classification Search
USPC ....................................... 330/10, 207 A, 251
See application file for complete search history.

(56) References Cited

U.S. PATENT DOCUMENTS

| | | | |
|---|---|---|---|
| 9,733,276 B2 | 8/2017 | Maschera et al. | |
| 2005/0253648 A1 | 11/2005 | Shin | |
| 2009/0169022 A1 | 7/2009 | Kost | |
| 2016/0065087 A1* | 3/2016 | Nagaoka | ............ G01R 19/0092 324/139 |
| 2017/0153278 A1 | 6/2017 | Maschera et al. | |

FOREIGN PATENT DOCUMENTS

| | | |
|---|---|---|
| EP | 2284992 B1 | 1/2013 |
| KR | 101312546 B1 | 9/2013 |

OTHER PUBLICATIONS

Texas Instruments, Low-Frequency Antenna Driver for Passive Start and Passive Entry, TPIC84125-Q1, SLDS175, Aug. 2010.
Hermanus J. Effing, U.S. Appl. No. 15/900,051, filed Feb. 20, 2018, entitled Switching Amplifier Circuit with Amplitude Control.
Dimitar M. Dochev et al., U.S. Appl. No. 15/626,278, filed Jun. 19, 2017, entitled Extended Drain NMOS Transistor with Buried P Type Region.

(Continued)

*Primary Examiner* — Hieu P Nguyen

(57) ABSTRACT

A switching amplifier circuit (200) connected to drive an impedance-based output load (230) includes high side and low side switches (201-204) configured and connected to connect first and second supply voltage lines to first and second output nodes (ANTP, ANTN) in response to gating control signals, and also includes an output current sensing circuit for measuring a current through the output load with a current sensing resistor (Rs) connected between the second supply voltage line and a source of one or more split gate-source switching transistors (203C) in the low side gate-source switching transistor, where a voltage sense circuit connected across the current sensing resistor is configured to sample a voltage across the current sensing resistor for measuring a sense current at the current sensing resistor.

18 Claims, 3 Drawing Sheets

(56) References Cited

OTHER PUBLICATIONS

ATMEL Corporation, ATA5279/ATA5279C Antenna Driver for Multiple Antennas, DataSheet, 2014.
ATMEL Corporation, ATA5291, PEPS Driver and Immobilizer Base Station, Summary Datasheet, 2015.
Hassan Pooya Forghani-Zadeh et al., Current-Sensing Techniques for DC-DC Converters, The 2002 45th Midwest Symposium on Circuits and Systems, Aug. 4-7, 2002. MWSCAS-2002.
Mayfield et al., "BiCMOS Low Common Mode and Offset Voltage Amplifier", Proceedings of the 1996 Bipolar/BiCMOS Circuits and Technology Meeting, Sep. 29, 1996, pp. 212-215, IEEE, Piscataway, NJ, USA.
Wang et al., "High-Performance Split-Gate-Enhanced UMOSFET With Dual Channels", IEEE Transactions on Electron Devices, Apr. 1, 2017, pp. 1455-1460, vol. 64, No. 4, IEEE, Piscataway, NJ, USA.
Shur, Michael; "Split-Gate Field-Effect Transistor"; Applied Physics Letter, vol. 54, pp. 162-164; Jan. 9, 1989.
Yuan et al., "A novel split-gate MOSFET design realized by a fully silicided gate process for the improvement of transconductance and output resistance," IEEE Electron Device Letters, vol. 26, No. 11, Nov. 2005, pp. 829-831.

\* cited by examiner

LOW COST LF DRIVER CURRENT SENSE TOPOLOGY

BACKGROUND OF THE INVENTION

Field of the Invention

The present invention is directed in general to field of sensing in switching power amplifiers. In one aspect, the present invention relates to a method, apparatus, architecture, and system for measuring an output current in an integrated circuit switching amplifier.

Description of the Related Art

Switching amplifiers are increasingly used to detect and reproduce audio or low-frequency (LF) signals in a variety of electronic circuit applications, such as power electronics circuits in the automotive industries as well as many other portable applications. The vast majority of these electronic circuit applications are embodied with integrated circuits. A specific example of an LF, amplifier in an integrated circuit is a basic four-switch Class-D driver (or amplifier) design with output amplitude-control clamp circuitry in the form of regulators and diodes. In such driver designs, the four switches are commonly implemented as field-effect transistors (FETs) driven in common mode, with opposing-phase signals driving a pair of high-side FETs and a pair of low-side FETs. For some specific LF transmission systems, such as passive keyless automotive entry systems, it is required to control the load current over a wide range. However, it is not a trivial matter to accurately measure current flow from such amplifiers due to the switched nature of the output signal as well as the cost and complexity with existing current sensing approaches; such as using an external sense resistor in series with the LF antenna, or using current copy circuitry to generate a small copy of the actual L driver output current. Other solutions include digitizing the output current (i.e., converting it into a digital signal) which would typically require a 12-bit analog-to-digital converter. As seen from the foregoing, existing current sense solutions are extremely difficult at a practical level by virtue of the challenges posed from design complexity, power control needs, and increased cost and size.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

A high performance switching amplifier current sense circuit, system, architecture, and methodology are described for efficiently and accurately measuring a driver current by using an embedded split gate-source transistor switch having separate power and sense transistors so that a current sense resistor placed only on the source of the small sense transistor(s) may be used to efficiently and accurately measure the driver current. In selected differential class-D switching amplifier embodiments, the disclosed switching amplifier current sense circuit includes an output driving circuit including a high side split gate-source switching transistor and low side gate-source switching transistor connected in series between a pair of supply voltage lines; a switch driver circuit configured to drive the switching transistors with first and second respective control signals; an output connection between the switching transistors for driving an output load; an output current sensing circuit for measuring a current through the output load with an integrated circuit current sensing transistor connected between a supply voltage line (e.g., ground) and the source of one or more split gate-source switching transistors in the low side gate-source switching transistor; and a voltage sense circuit connected across the current sensing resistor, wherein the voltage sense circuit is configured to sample a voltage across the current sensing resistor.

While the present disclosure may be used in a wide variety of switching amplifier designs, for the sake of brevity, the present description refers to selected switching amplifier embodiments without describing in detail conventional techniques related to signal amplification circuitry in the form of electronic switches and control circuit affecting or acting on the electronic switches and/or output-driver circuitry of the signal amplification circuitry. Furthermore, the connecting lines shown in the various figures contained herein are intended to represent example functional relationships and/or physical couplings between the various elements. In certain implementations, aspects of the present disclosure have been shown to be beneficial when used in the context of a differential Class-D amplifier and/or in connection with portable and automotive applications in the amplifiers drive antenna loads. While not necessarily so limited, various aspects may be appreciated through the following discussion of non-limiting examples which use exemplary contexts. Accordingly, aspects of the present disclosure are believed to be applicable to a variety of different types of switching amplifier circuits, systems, architectures, and methods which use control circuitry to affect or act on the electronic switches and/or output-driver circuitry so that a ramped output drive signal minimizes AM band emissions that arise from activation and deactivation of the switching amplifier.

Figure 1:
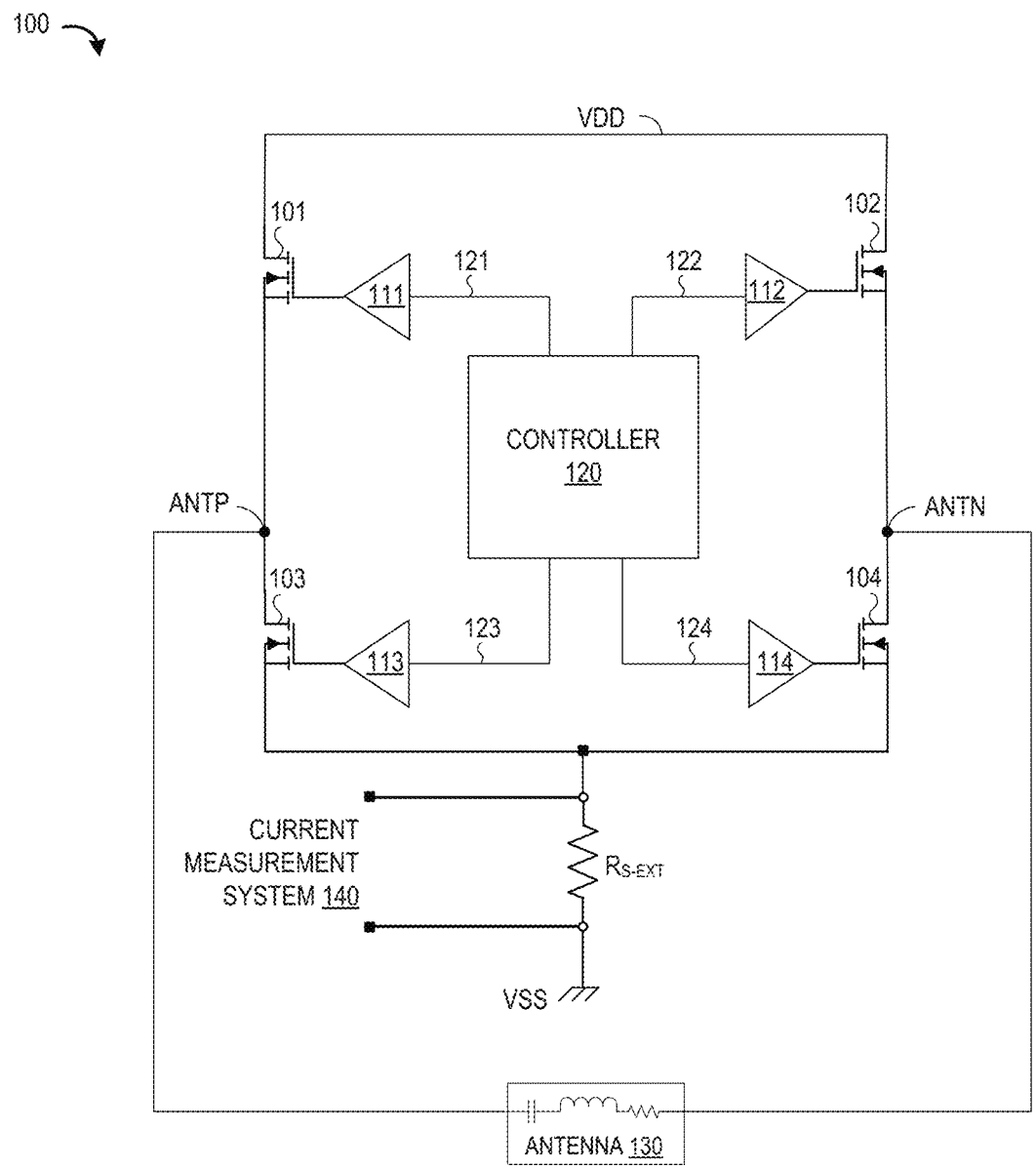
FIG. 1 illustrates a switching amplifier connected in an antenna circuit configuration.

To provide additional details for an improved understanding of the limitations of conventional switching amplifier designs, reference is now made to FIG. 1 which illustrates a switching amplifier 100 connected in an antenna circuit configuration. As illustrated, the switching amplifier 100 may be connected as the output stage of a high power driver which includes four high power transistors 101-104 connecting an antenna load 130 between first and second reference voltages. The high power transistors 101-104 are typically transistors that handle 0.5 A to 100 A (or more) for driving various applications, as opposed to low power transistors that are primarily used to control the operation of the various applications without directly handling the high current. On a first circuit branch, the high power transistors 101, 103 are connected in series between a first reference voltage (e.g., Vdd) and a second reference voltage (e.g., Vss or ground), And on the second circuit branch, the high power transistors 102, 104 are connected in series between the first and second reference voltages Vdd. As shown, an antenna load 130 is connected between a first node ANTP between the high power transistors 111, 113 and a second node ANTN between the high power transistors 112, 114. A controller 120 provides gate drive signals 121-124 to respective gate driver circuits 111-114 for the high power transistors 101-104 to control the direction of the current flowing through the antenna load 130 so that current flows only when activated, but not when disabled.

During the active mode of operation, the output of the antenna switching amplifier 100 is measured with a current sensing circuit which includes an external current sensing resistor $R_{S-EXT}$ connected between the source terminals of the low-side switching NMOS transistors 103, 104 and the second reference voltage (e.g., Vss or ground), In such an arrangement, a current or voltage measurement system 140 may be connected to the external sense resistor to detect the voltage drop or current flow through the resistor $R_{S-EXT}$. As will be appreciated, other current sense techniques may be used, such as by connecting an external current sensing resistor $R_{S-EXT}$ to the output of an antenna load that is driven by a linear amplifier connected in a half bridge topology, or by using current copy circuitry generating a small copy of the actual LF driver output current. However, the use of a low ohmic, high power, accurate series resistor or a full embedded current copy circuit requires significant die area and additional signal processing in order to satisfy the current measurement accuracy requirements.

Figure 2:
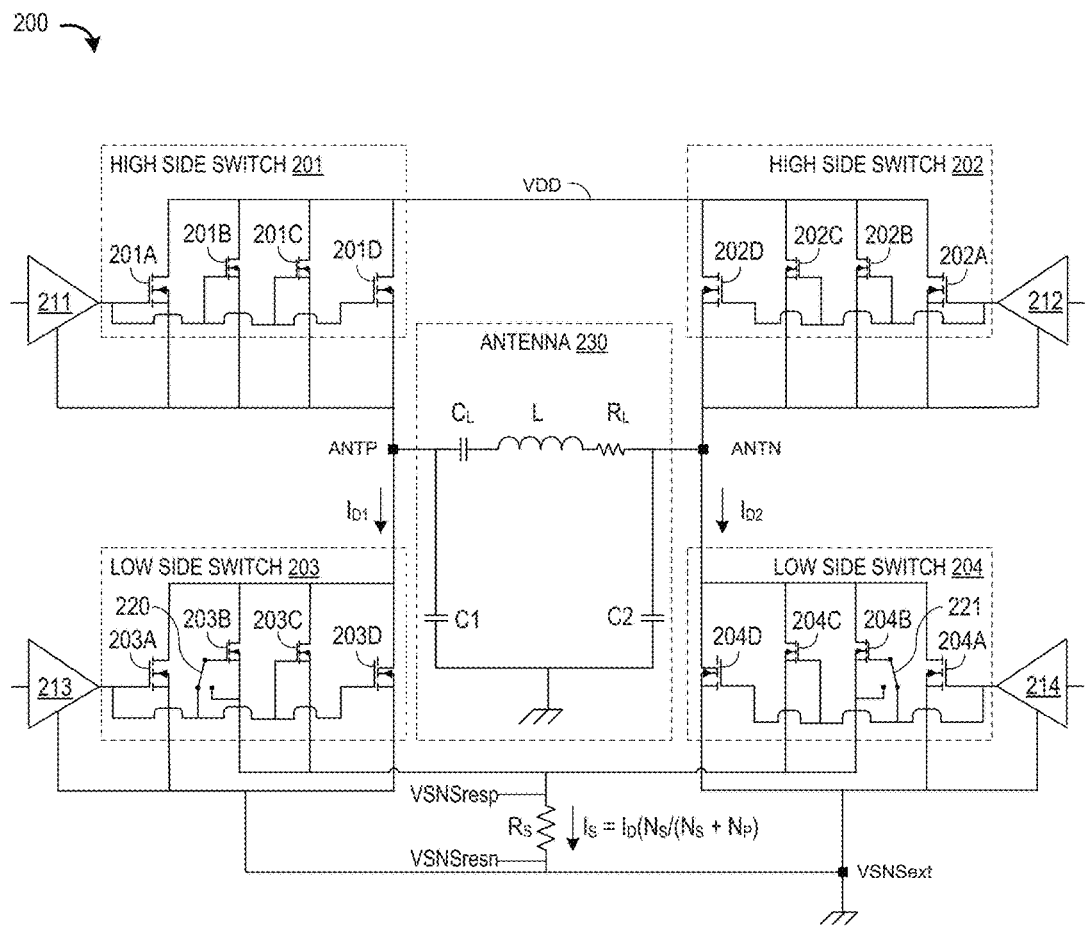
FIG. 2 illustrates a circuit schematic diagram of a switching amplifier connected in an antenna circuit configuration with an embedded, internal driver current sense circuit which provides a low cost, area-efficient, low resistance implementation for accurately measuring the antenna driver current in accordance with selected embodiments of the present disclosure.

To address these limitations and others associated with conventional switching amplifier current sense designs, reference is now made to FIG. 2 which depicts a simplified circuit schematic diagram of a switching amplifier 200 connected in an antenna circuit configuration with an embedded, internal driver current sense circuit which provides a low cost, area-efficient, low resistance implementation for accurately measuring the antenna driver current in accordance with selected embodiments of the present disclosure. As illustrated, the switching amplifier 100 is connected as the output stage of a high power driver which includes field-effect transistors (FETs, or NMOS FETs) including high-side transistors 201, 202 and low-side transistors 203, 204 connecting an antenna load 230 between first and second reference voltages Vdd, Vss. As disclosed herein, each of the transistors (e.g., 201) may be constructed as a split gate-source transistor to define a plurality of constituent transistors (e.g., 201A-D) having a shared drain terminal with separate (or "split") gate terminals and source terminals at each constituent transistor. In selected embodiments, the transistors 201A-D are not separate transistors, but a single transistor having separate source fingers formed in the substrate such that the transistor structure 201A-D is electrically isolated (e.g., with deep trench isolation structures, junction isolation structures, SOI trench isolation structures, and the like) from other devices or circuits formed in the substrate (e.g., 202A-D, 203A-D, 204A-D as well as any of the components constituting structures 211-214) as described more fully hereinbelow, With the split gate-source structure, one or more of the constituent transistors (e.g., 201B, 201C) may have different sizes than other constituent transistors (e.g., 201A, 201D). For the high-side transistor 201, the constituent transistors 201A-D may have a shared drain connected to the first reference voltage Vdd while the split gate terminals are connected in common to the gate drive signal from the gate driver circuitry 211 and the split source terminals are connected in common to the first antenna node ANTP. In similar fashion, the high-side transistor 202 has its constituent transistors 202A-D connected over a shared drain to the first reference voltage Vdd while the split gate terminals are connected in common to the gate drive signal from the gate driver circuitry 212 and the split source terminals are connected in common to the second antenna node ANTN.

In the low-side transistors 203-204, the split gate-source structure enables the constituent transistors to be constructed as one or more relatively large power transistors (e.g., 203 A, 203D) and one more relatively small current sense transistors (e.g., 203B-C) which are connected over a small series sense resistor Rs to form a current sensing circuit for measuring the drive current $I_{D1}$ at the first antenna node ANTP. In particular, by connecting the sense resistor Rs between the source of the current sense transistor(s) 203B, 203C and the source of the power transistor(s) 203A, 203D, the first circuit branch drive current $I_{D1}$ at the first antenna node ANTP can be measured by controlling and measuring the sense current $I_S$ from the current sense transistor(s) 203B, 203C which flows through the sense resistor Rs by measuring the differential voltages VSNSresp, VSNSresn across the sense resistor Rs. This current sensing arrangement is mirrored on the second circuit by connecting the sense resistor Rs between the source of the current sense transistor(s) 204B, 204C and the source of the power transistor(s) 204A, 204D to measure the second circuit branch drive current $I_{D2}$ at the second antenna node ANTN by controlling and measuring the sense current $I_S$ from the current sense transistor(s) 204B, 204C which flows through the sense resistor Rs and measuring the differential voltages VSNSresp, VSNSresn.

With the disclosed current sense topology 200 of the sense resistor Rs connected to the source of the current sense transistor(s) 203B 203C, an area-efficient and low cost current sense circuit is provided that does not meaningfully increase the effective switch RDSon and that provides sufficient current measurement accuracy for targeted LF driver applications. This is achieved by forming each low-side split gate-source transistor with constituent transistors having different or unequal sizes so that the smaller current sense transistor(s) 203B, 203C pass current to the sense resistor Rs, thereby ensuring substantially equal bias voltage of the current sense transistor(s) 203B, 203C and the power transistor(s) 203A, 203D, And by limiting the maximum voltage over the sense resistor Rs, the required measurement accuracy is obtained. In addition, the power transistor(s) and current sense transistor(s) of each switch are properly matched by virtue of fabricating the transistor devices in the same silicon processing environment.

By sizing the current sense transistor(s) (e.g., 203B, 203C) to limit the current flow being measured, the sense resistor Rs may be implemented internally as an integrated circuit resistor across which the differential voltages VSNSresp, VSNSresn are measured and converted to accurately measure the antenna current (e.g., ±3-4%). The proposed split gate-source power switching transistor makes it possible to implement the sense resistor Rs with a small die area and minimal additional costs, and its resistance value can be increased to several (tens of) ohms without increasing the total switch resistance too much, as only the current passing through the sense current transistor(s) passes through it. In particular, the proposed split gate-source power switching transistor implementation allows the sense current fraction to be readily adapted to the sense resistor value which can be integrated at reasonable costs. For example, with a typical sheet resistance of polysilicon resistors (e.g., approximately 200 Ohm/square), the following resistance value versus area requirements may be obtained:

Rs=200 Ohm=>1 Squares needed
Rs=20 Ohm=>10 Squares needed
Rs=2 Ohm=>100 Squares needed
Rs=0.2 Ohm=>1000 squares needed.

If the split gate-source power FET includes 50 sense fingers, this implies a ratio of 1:50, 2:50, 3:50, etc. For a 1:50 ratio with 150 mV sense voltage for a 1.25 A current, a 6 Ohm resistor is needed. For 2:50 ratio, a 3 Ohm resistor is needed, etc. As a result, the smallest (thus lowest cost) resistor is obtained when using the maximum possible sense current ratio.

To provide operational flexibility to the current sense circuit, one or more low-side current sense transistor(s) (e.g., 203C, 204C) may be programmably connected with one or more switches 220, 221 to improve current sensing performance for different antenna current ranges, With the programmable switching arrangement, one or more additional current sensing transistors can effectively be added (e.g., the switch 220 is turned ON) to provide a larger fraction of the drive current $I_D$ to the sense resistor Rs for measurement when the drive current $I_D$ is relatively small, thereby assuring that the differential voltage measure VSNSresp, VSNSresn can be used to measure small input signals. By the same token, one or more current sensing transistors can effectively be removed (e.g., the switch 220 is turned OFF) when the drive current $I_D$ is relatively large to provide a smaller fraction of the drive current $I_D$ to the sense resistor Rs for measurement, thereby keeping the differential voltage measure VSNSresp, VSNSresn from exceeding a specified range. Generally speaking, the ratio of the actual number of current sense transistors Ns (or source "fingers" connected to the sense resistor) to the total number of power transistors Np and current sense transistors Ns determines what portion of the drive current $I_D$ is provided as sense current $I_S$ to the sense resistor Rs. Stated equationally, $I_S \approx I_D(Ns/(Ns+Np))$. As seen from this equation, increasing the number of current sense transistors being connected and driven by the gate driver circuitry 213 leads to a larger $I_S$ fraction of the full powerFET current $I_D$. This concept may be used to adapt the size of the sense current $I_S$ to the maximum current expected to flow through the low-side switch such that the measurement system measuring the resulting sense voltage ($V_S = I_S \times R_S$) is neither overdriven nor operated with small input signals that are too small (leading to a poor signal-to-noise ratio and inaccurate measurement performance.

In the example shown in FIG. 2, the programmable control of the sense current is provided in the low-side switch 203 of the first circuit branch with a gate connection switch 220 for switching the gate of the current sense transistor 203B to a first switch position (connecting the gate of transistor 203B to the common gate voltage of the low side switch 203) so that the transistor 203B is part of the switch 203 that will conduct its share of the current. Alternatively, the gate connection switch 220 switches the gate of the current sense transistor 203B to a second switch position (connecting the gate of transistor 203B to its source) so the transistor 203B is turned OFF and will not conduct current. In the first switch position of the gate connection switch 220, the voltage of the sense resistor is created by the current conducted by the 203C+203B fingers, while in the second position of the gate connection switch 220, the voltage is created by the current conducted by the 203C finger only.

Similarly, the low-side switch 204 on the second circuit branch may include a gate connection switch 221 for switching the gate of the current sense transistor 204B to a first switch position (connecting the gate of transistor 204B to the common gate voltage of the low side switch 204) or a second switch position (connecting the gate of transistor 204B to its source). In the first switch position, the current sense transistor 203B, 204B drives a larger drive current to the sense resistor Rs for cases when the input current $I_D$ is relatively small, with the source current from transistor 204B being turned ON to contribute to the drive current through the sense resistor. However, in the second switch position, the current sense transistor 204B is turned OFF and will not conduct current, passing less drive current to the sense resistor Rs for cases when the input current $I_D$ is relatively large.

To provide additional details for an improved understanding of selected embodiments of the present disclosure, reference is now made to Table 1 (below) which illustrates the sense current $I_S$ and sense voltage $V_S$ when the connection switch 220 is open (CurSenseFrac=0) to drive less sense current $I_S$ as a percentage of the input current $I_D$, and for when the connection switch 220 is closed (CurSenseFrac=1) to drive more sense current as a percentage of the input current $I_D$:

TABLE 1

LF-driver CurSenseFrac Force-Sense Ratio Control At Internal Current Sensing

|  | CurSenseFrac = 0 | CurSenseFrac = 1 |
| --- | --- | --- |
| Sense Current | $I_S = 0.02 * I_D$ | $I_S = 0.04 * I_D$ |
| Sense Voltage | $V_S = 0.10 * I_D$ | $V_S = 0.20 * I_D$ |

By programmably controlling the connection of one or more current sense transistors into the low-side switch, the sense voltage $V_S$ developed over the sense resistor $R_S$ can be controlled within a specified value (e.g., limited to 150 mV) to prevent significant current sense errors due to the voltage mismatches between the power transistor(s) (e.g., 203A, 203D) and the current sense transistor(s) (e.g., 203B, 203C). With the circuit parameters shown in Table 1, the sense current $I_S$ is controlled to provide a peak sense voltage amplitude of 125 mV on the sense resistor and a maximum antenna current level of 1.25 A in the low CurSenseFrac setting.

Figure 3:
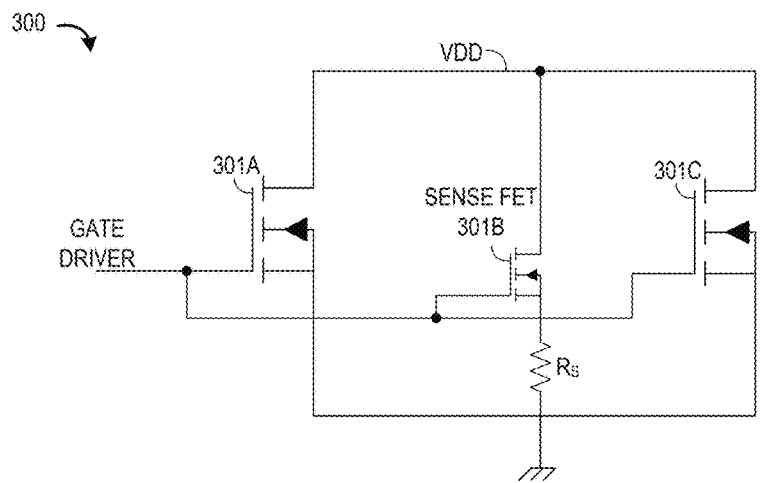
FIG. 3 illustrates a simplified circuit schematic diagram of a current sensor embodied in a split gate-source power FET and embedded sense resistor in accordance with selected embodiments of the present disclosure.

To provide additional details for an improved understanding of selected embodiments of the present disclosure, reference is now made to FIG. 3 which depicts a simplified circuit schematic diagram of a current sensor 300 embodied in a split gate-source power FET 301 and embedded sense resistor Rs. As depicted, the current sensor 300 includes an input terminal for receiving the gate driver signal that is applied in common to the gates of the split gate-source transistor 301 defining a first power transistor 301A, second sense transistor 301B, and third power transistor 301C. As formed, the transistors 301A-C have a shared drain terminal connected in common to a first supply voltage Vdd, a plurality of separate (or "split") gate terminals connected in common to the gate driver signal, and a plurality of separate or "split" source terminals which are connected as shown. In particular, the source terminals for the power transistors 301A, 301C may be connected in common to the second supply voltage (e.g., ground), but the source terminal for the smaller sense transistor 301B may be connected to a first terminal of the sense resistor Rs having its second terminal connected to the second supply. In this configuration, current sensing may be implemented with embedded switches of a power transistor by splitting the embedded switches into power transistors and one or more current sense transistors, with a current sense resistor Rs placed only in the source of the small current sense transistor(s).

Figure 4:
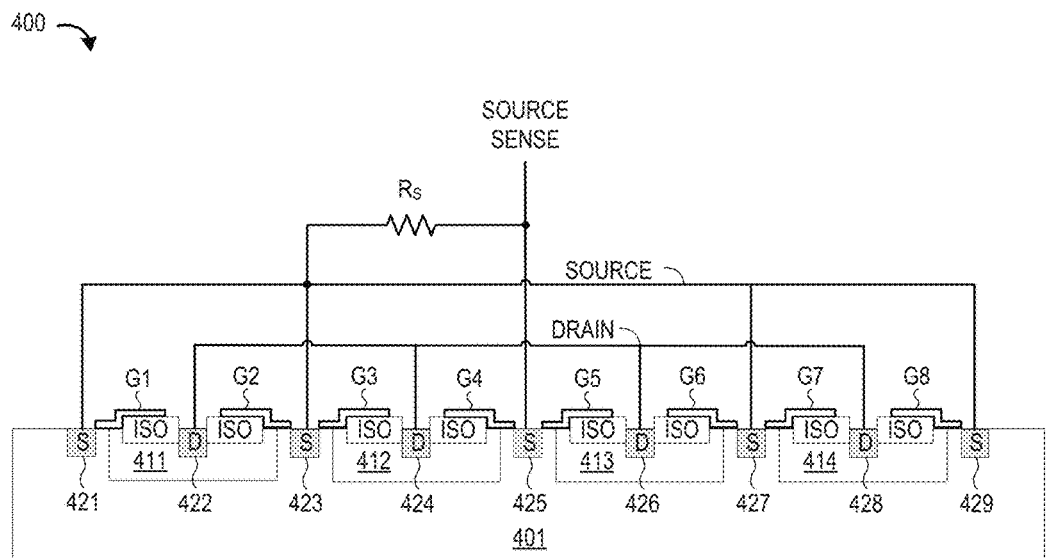
FIG. 4 illustrates a cross-sectional view of an integrated circuit current sensor in accordance with selected embodiments of the present disclosure.

To provide additional details for an improved understanding of selected embodiments of the present disclosure, reference is now made to FIG. 4 which depicts a cross-sectional view of an integrated circuit current sensor 400. As illustrated, the current sensor 400 may be formed in semiconductor substrate 401 using any desired semiconductor fabrication process in which a plurality of conductive substrate regions 411-414, 421-429 are formed in the substrate 401 to be separated from one another by defined isolation regions (ISO) over which gate electrode stages G1-G8 are selectively patterned to form a split gate-source power field effect transistor as a plurality of embedded power and current sense switches having an embedded sense resistor Rs connected between the source of the small current switches) the source of the power switch(es). For example, a laterally diffused MOSFET (LDMOS) fabrication sequence may process a semiconductor wafer substrate layer 401, such as an p-type substrate formed with monocrystalline semiconductor material (e.g., silicon), to form defined N-well regions 411-414, such as by employing an implant mask to selectively implant N-type dopants (e.g., phosphorous, arsenic) at a first specified dosage and energy through a patterned mask to form N-well regions 411-414. Before or after forming the N-wells, the wafer may be processed to form isolation structures ISO at the upper portion of layer 401, such as by using an LOCOS process to etch or otherwise form trenches in the substrate that are filled with a dielectric material, such as silicon oxide, to defined separate isolation structures ISO. Of course, the isolation structures ISO may also be formed after forming the N and P-wells by subsequent deposition, patterning and etching of dielectric material, such as silicon oxide. The formation of the isolation structures ISO is controlled to locate each isolation structure ISO within the N-well regions so as to separate the drain regions D (formed in the N-wells) from the source regions S (formed outside of the N-wells).

To control the relative location of the isolation structures ISO in relation to the drain regions D, a selective implantation process may selectively implant N-type dopants at a second specified dosage and energy using a drain implant mask (not shown) in combination with the isolation structures ISO to selectively implant the N-type drain regions 422, 424, 426, 428. Subsequently, the gate layers G1-G8 may be defined by depositing, patterning and etching a (conductive) layer (e.g., polysilicon or other gate material(s) over wafer 401 using any desired photolithographic etch sequence. Though not shown, each gate layer includes one or more gate dielectric layers formed in contact with at least the underlying substrate, such as by oxidizing the substrate 401 to form a layer of oxide or otherwise depositing or growing a dielectric material. After forming the gate layers G1-G8, the relative location of the isolation structures ISO in relation to the source regions S is controlled with a selective implantation process which selectively implants N-type dopants at a third specified dosage and energy using a source implant mask (not shown) in combination with gate layers G1-G8 to selectively implant the N-type drain regions 421, 423, 425, 427, 429. Subsequently, one or more conductive layers are formed within an interconnect stack (not shown) to define the depicted circuit connections. In particular, one or more first conductor layers are formed to connect the drain terminals 422, 424, 426, 428 in common to a shared node which is directly, electrically connected to the first reference supply voltage (e.g., Vdd). In addition, one or more second conductor layers are formed to connect the source terminals 421, 423, 427, 429 in common to a shared node which is directly, electrically connected to the second reference supply voltage (e.g., ground). Finally, one or more third conductor layers are formed to connect the source terminal 425 to first terminal of an integrated circuit sense resistor Rs having its second terminal connected to the second reference supply voltage (e.g., ground). With the disclosed semiconductor fabrication process, the resulting power FET topology provides improved geometrical, mechanical, and thermal matching between split source and gate structures within the same substrate region.

By now it should be appreciated that there has been provided a switching amplifier circuit, apparatus, method, and system with a current sensing circuit for accurately and efficiently measuring output current from the switching amplifier. In the disclosed embodiments, the switching amplifier circuit includes an output driving circuit including a high side switching transistor and low side split gate-source switching transistor connected in series between first and second supply voltage lines. In selected embodiments, the output driving circuit includes first and second high side split gate-source switching transistors which are configured and arranged to connect the first supply voltage line to, respectively, first and second output connections in response to first and second gating control signals, and also includes first and second low side split gate-source switching transistors which are configured and arranged to connect the second supply voltage line to, respectively, the first and second output connections in response to the first and second gating control signals. The switching amplifier circuit also includes a switch driver circuit configured to drive the switching transistors with first and second respective control signals, with the switching transistors having an output connection between the switching transistors for driving an output load. In selected embodiments, the output driving circuit is a Class D amplifier connected to drive the output load which may be an impedance-based antenna load having an inductor coupled between the first and second output connections for conveying modulated signals wirelessly from the switching amplifier circuit for receipt and demodulation by another circuit. In other embodiments, the impedance-based antenna load is configured and arranged to convey modulated signals wirelessly, at a carrier frequency of at least ten kilohertz, from the switching amplifier circuit for receipt and demodulation by a key-fob circuit. In addition, the switching amplifier circuit includes an output current sensing circuit for measuring a current through the output load with a current sensing resistor connected between the second supply voltage line and a source of one or more split gate-source switching transistors in the low side split gate-source switching transistor. Finally, the switching amplifier circuit includes a voltage sense circuit connected across the current sensing resistor, wherein the voltage sense circuit is configured to sample a voltage across the current sensing resistor for measuring a sense current at the current sensing resistor. In selected embodiments, the high side split gate-source switching transistor includes a first power transistor and a second current sense transistor connected in parallel between the first supply voltage line and the output connection and driven by a shared gate control signal, where the first power transistor is larger than the second current sense transistor and where the first and second power transistors share a substrate region are isolated from other components by substrate isolation structures. In other embodiments, the low side split gate-source switching transistor includes a first power transistor and a second, smaller current sense transistor, each having a drain node directly connected to the output connection and a gate node driven by a shared gate control signal, where a source node of the first power transistor is connected to the second power supply line, and where a source node of the current sense transistor is connected to the current sensing resistor. In yet other embodiments, the low side split gate-source switching transistor comprises a third current sense transistor having a drain node directly connected to the output connection and source node connected to the current sensing resistor, where a gate node of the third current sense transistor is connected by a connection switch to the shared gate control signal in a first connection state, and is connected by the connection switch to the source node of the third current sense transistor in a second connection state so that less current is provided to the current sensing resistor in the second state than in the first state.

In another form, there is provided a circuit, apparatus, method, and system for accurately output current. In the disclosed embodiments, the circuit includes a switching amplifier, switch driver circuit, and output current sensing circuit. The switching amplifier includes a high side switching transistor and low side split gate-source switching transistor connected in series between first and second supply voltage lines with an output connection between the high side and low side switching transistors for driving an output load, which may include an impedance-based load having an inductor coupled between first and second output connection nodes. In addition, the output current sensing circuit is provided for measuring a current through the output load, and includes a current sensing resistor connected between the second supply voltage line and a source of one or more split gate-source switching transistors in the low side split gate-source switching transistor. As formed, the current sensing resistor is an integrated circuit resistor formed in a common semiconductor substrate for the circuit. In selected embodiments, the switching amplifier includes first and second high side electronic switches configured and arranged to connect the first supply voltage line to, respectively, first and second output connection nodes of the output driving circuit in response to first and second gating control signals, and also includes first and second low side split gate-source switching transistors configured and arranged to connect the second supply voltage line to, respectively, the first and second output connection nodes in response to the first and second gating control signals from the switching driver circuit. In selected embodiments, the first and second high side split gate-source switching transistors and first and second low side split gate-source switching transistors are part of a Class D amplifier connected to drive the output load comprising an impedance-based antenna load comprising an inductor coupled between the first and second output connections for conveying modulated signals wirelessly from the switching amplifier circuit for receipt and demodulation by another circuit. In other embodiments, the low side split gate-source switching transistor includes a first power transistor and a second, smaller current sensing transistor, each having a drain node directly connected to the output connection and a gate node driven by the first control signal, where a source node of the first power transistor is connected to the second supply voltage line, and where a source node of the current sensing transistor is connected to the current sensing resistor. In addition, the low side split gate-source switching transistor may include a third current sense transistor having a drain node directly connected to the output connection and source node connected to the current sensing resistor, where a gate node of the third current sense transistor is connected by a connection switch to the first control signal in a first connection state, and is connected by the connection switch to the source node of the third current sense transistor in a second connection state so that less current is provided to the current sensing resistor in the second state than in the first state. In selected embodiments, the current sensing resistor is a polysilicon resistor, and may have a resistance between 0.2 Ohms and 200 Ohms. The circuit may also include a voltage sense circuit connected across the current sensing resistor, wherein the voltage sense circuit is configured to sample a voltage across the current sensing resistor for measuring a sense current at the current sensing resistor.

In yet another form, there is provided a wireless communication system, circuit, apparatus, and method for measuring current at an output load. In the disclosed embodiments, the wireless communication system includes a key-fob circuit configured and arranged to receive and respond to modulated signals wirelessly. In addition, the wireless communication system includes a Class-D switching amplifier circuit connected to drive an impedance-based load connected between first and second output nodes. In selected embodiments, the impedance-based load comprises an inductor coupled between first and second output nodes, where the impedance-based load is configured and arranged to convey modulated signals wirelessly from the Class-D switching amplifier circuit for receipt and demodulation by the key-fob circuit. As disclosed, the Class-D switching amplifier circuit includes first and second high side electronic switches configured and arranged to connect a first reference voltage to, respectively, the first and second output nodes in response to first and second gating control signals. In addition, the Class-D switching amplifier circuit includes first and second low side split gate-source electronic switches configured and arranged to connect a second reference voltage to, respectively, the first and second output nodes in response to the first and second gating control signals. Finally, the Class-D switching amplifier circuit includes an output current sensing circuit for measuring a current through the impedance-based load with a current sensing resistor connected between the second reference voltage and a source of one or more split gate-source switching transistors in the low side split gate-source switching transistor. As disclosed, the current sensing resistor may be formed as a polysilicon resistor having a resistance value of approximately 200 Ohms or less. The wireless communication system may also include a voltage sense circuit connected across the current sensing resistor, wherein the voltage sense circuit is configured to sample a voltage across the current sensing resistor for measuring a sense current at the current sensing resistor.

Because selected embodiments implementing the present invention are, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure. It should also be understood that the terminology is used for notational convenience only and that in actual use the disclosed structures may be oriented different from the orientation shown in the figures. Thus, the terms should not be construed in a limiting manner. In addition, it will be appreciated that certain terms may have some overlap in meaning. One example in this regard is the term an "electrode" which might be considered part of a "wire" does not limit a function of a component or the related circuitry. In many contexts, a design may characterize electrical connections with "electrode" being used as part of a "wiring" and in other designs, vice versa. Further, the term "electrode" or "wiring" can also mean a combination of a plurality of "electrodes" and "wirings" formed in an integrated manner. Also, when illustrating exemplary designs with use of a FET, the functions of the FET's source and drain might be switched depending on operation conditions and relative voltage polarities, for example, when a transistor having opposite polarity is employed or the direction of current flow is changed in circuit operation, reference to the term "source" or "source terminal" of the FET can be interchanged with "drain" or "drain terminal". Accordingly, the terms "source" and "drain" can be switched in this Specification, and similarly, these terms might also be used interchangeably with the terms "source/drain" and "drain/source".

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

The term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

Although the described exemplary embodiments disclosed herein are directed to methods and systems for measuring the output current in a differential class-D switching amplifier circuit, system, architecture, and methodology, the present invention is not necessarily limited to the example embodiments illustrate herein, and various embodiments of the circuitry and methods disclosed herein may be implemented with other devices and circuit components. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A switching amplifier circuit comprising:
   an output driving circuit comprising a high side switching transistor and low side split gate-source switching transistor connected in series between first and second supply voltage lines;
   a switch driver circuit configured to drive the switching transistors with first and second respective control signals;
   an output connection between the switching transistors for driving an output load; and
   an output current sensing circuit for measuring a current through the output load with a current sensing resistor connected between the second supply voltage line and a source of one or more split gate-source switching transistors in the low side split gate-source switching transistor, wherein the one or more low side split gate-source switching transistors comprises a current sense transistor having a drain node directly connected to the output connection, a source node connected to the current sensing resistor, and a gate node, the gate node of the current sense transistor connected by a connection switch to a shared gate control signal in a first connection state and to the source node of the current sense transistor in a second connection state so that less current is provided to the current sensing resistor in the second state than in the first state.

2. The switching amplifier circuit of claim 1, wherein the output driving circuit comprises:
   first and second high side split gate-source switching transistors configured and arranged to connect the first supply voltage line to, respectively, first and second output connections in response to first and second gating control signals; and
   first and second low side split gate-source switching transistors configured and arranged to connect the second supply voltage line to, respectively, the first and second output connections in response to the first and second gating control signals.

3. The switching amplifier circuit of claim 2, where the output driving circuit comprises a Class D amplifier connected to drive the output load.

4. The switching amplifier circuit of claim 3, where the output load comprises an impedance-based antenna load comprising an inductor coupled between the first and second output connections for conveying modulated signals wirelessly from the switching amplifier circuit for receipt and demodulation by another circuit.

5. The switching amplifier circuit of claim 4, where the impedance-based antenna load is configured and arranged to convey modulated signals wirelessly, at a carrier frequency of at least ten kilohertz, from the switching amplifier circuit for receipt and demodulation by a key-fob circuit.

6. The switching amplifier circuit of claim 1, where the high side switching transistor comprises a split gate-source switching transistor comprising a first power transistor and a second current sense transistor connected in parallel between the first supply voltage line and the output connection and driven by a shared gate control signal, where the first power transistor is larger than the second current sense transistor and where the first and second power transistors share a substrate region are isolated from other components by substrate isolation structures.

7. The switching amplifier circuit of claim 1, where the low side split gate-source switching transistor comprises a first power transistor and a second current sense transistor, each having a drain node directly connected to the output connection and a gate node driven by the shared gate control signal, where a source node of the first power transistor is connected to the second power supply line, and where a source node of the current sense transistor is connected to the current sensing resistor.

8. The switching amplifier circuit of claim 1, further comprising a voltage sense circuit connected across the current sensing resistor, wherein the voltage sense circuit is configured to sample a voltage across the current sensing resistor for measuring a sense current at the current sensing resistor.

9. The switching amplifier circuit of claim 1, further where the high side switching transistor comprises a split gate-source switching transistor.

10. A circuit comprising:
a switching amplifier comprising a high side switching transistor and low side split gate-source switching transistor connected in series between first and second supply voltage lines;
an output connection between the high side and low side switching transistors for driving an output load;
a switch driver circuit configured to drive the high side switching transistor and low side split gate-source switching transistor with first and second respective control signals; and
an output current sensing circuit for measuring a current through the output load with a current sensing resistor connected between the second supply voltage line and a source of one or more split gate-source switching transistors in the low side split gate-source switching transistor,
where
the current sensing resistor is an integrated circuit resistor formed in a common semiconductor substrate for the circuit,
the one or more low side split gate-source switching transistors comprise a current sense transistor having a drain node directly connected to the output connection, a source node connected to the current sensing resistor, and a gate node, the gate node is connected by a connection switch to the first control signal in a first connection state, and is connected by the connection switch to the source node of the current sense transistor in a second connection state so that less current is provided to the current sensing resistor in the second state than in the first state.

11. The circuit of claim 10, where the switching amplifier comprises:
first and second high side split gate-source switching transistors configured and arranged to connect the first supply voltage line to, respectively, first and second output connection nodes of the output driving circuit in response to first and second gating control signals from the switching driver circuit; and
first and second low side split gate-source switching transistors configured and arranged to connect the second supply voltage line to, respectively, the first and second output connection nodes in response to the first and second gating control signals from the switching driver circuit.

12. The circuit of claim 11, wherein the first and second high side split gate-source switching transistors and first and second low side split gate-source switching transistors are part of a Class D amplifier connected to drive the output load comprising an impedance-based antenna load comprising an inductor coupled between the first and second output connections for conveying modulated signals wirelessly from the switching amplifier circuit for receipt and demodulation by another circuit.

13. The circuit of claim 10, where the current sensing resistor comprises a polysilicon resistor.

14. The circuit of claim 10, where the current sensing resistor has a resistance between 0.2 Ohms and 200 Ohms.

15. The circuit of claim 10, where the low side split gate-source switching transistor comprises a first power transistor and a second, smaller current sensing transistor, each having a drain node directly connected to the output connection and a gate node driven by the first control signal, where a source node of the first power transistor is connected to the second supply voltage line, and where a source node of the current sensing transistor is connected to the current sensing resistor.

16. The circuit of claim 10, further comprising a voltage sense circuit connected across the current sensing resistor, wherein the voltage sense circuit is configured to sample a voltage across the current sensing resistor for measuring a sense current at the current sensing resistor.

17. A wireless communication system comprising:
a key-fob circuit configured and arranged to receive and respond to modulated signals wirelessly; and
a Class-D switching amplifier circuit connected to drive an impedance-based load connected between first and second output nodes, comprising:
first and second high side electronic switches configured and arranged to connect a first reference voltage to, respectively, the first and second output nodes in response to first and second gating control signals; and
first and second low side split gate-source electronic switches configured and arranged to connect a second reference voltage to, respectively, the first and second output nodes in response to the first and second gating control signals; and
an output current sensing circuit for measuring a current through the impedance-based load with a current sensing resistor connected between the second reference voltage and a source of one or more split gate-source switching transistors in the low side split gate-source switching transistor,
where the current sensing resistor comprises a polysilicon resistor having a resistance value of approximately 200 Ohms or less, and the one or more low side split gate-source switching transistors comprise a current sense transistor having a drain node directly connected to the output connection, a source node connected to the current sensing resistor, and a gate node, the gate node is connected by a connection switch to the first gating control signal in a first connection state, and is connected by the connection switch to the source node of the current sense transistor in a second connection state so that less current is provided to the current sensing resistor in the second state than in the first state.

18. The wireless communication system of claim 17, further comprising a voltage sense circuit connected across the current sensing resistor, wherein the voltage sense circuit is configured to sample a voltage across the current sensing resistor for measuring a sense current at the current sensing resistor.

* * * * *